(12) United States Patent
Hu et al.

(10) Patent No.: US 10,110,788 B2
(45) Date of Patent: Oct. 23, 2018

(54) CAMERA DEVICE

(71) Applicant: TDK TAIWAN CORP., Yangmei Taoyuan (TW)

(72) Inventors: Chao-Chang Hu, Yangmei Taoyuan (TW); Chih-Wei Weng, Yangmei Taoyuan (TW); Cheng-Kai Yu, Yangmei Taoyuan (TW); Shu-Shan Chen, Yangmei Taoyuan (TW)

(73) Assignee: TDK TAIWAN CORP., Yangmei Taoyuan (TW)

( * ) Notice: Subject to any disclaimer, the term of this patent is extended or adjusted under 35 U.S.C. 154(b) by 0 days.

(21) Appl. No.: 15/418,000

(22) Filed: Jan. 27, 2017

(65) Prior Publication Data

US 2017/0223237 A1    Aug. 3, 2017

Related U.S. Application Data

(60) Provisional application No. 62/290,869, filed on Feb. 3, 2016.

(30) Foreign Application Priority Data

Dec. 29, 2016   (TW) .............................. 105143818 A

(51) Int. Cl.
*H04N 5/225* (2006.01)
*H05K 1/18* (2006.01)

(52) U.S. Cl.
CPC ......... *H04N 5/2252* (2013.01); *H04N 5/2253* (2013.01); *H04N 5/2254* (2013.01); *H04N 5/2258* (2013.01); *H05K 1/189* (2013.01); *H05K 2201/10151* (2013.01)

(58) Field of Classification Search
CPC .. H04N 5/2252; H04N 5/2253; H04N 5/2258; H05K 1/189
See application file for complete search history.

(56) References Cited

U.S. PATENT DOCUMENTS

| | | | |
|---|---|---|---|
| 2010/0225755 A1* | 9/2010 | Tamaki | H04N 5/2254 348/78 |
| 2010/0289908 A1* | 11/2010 | Ke | G02B 27/646 348/208.6 |
| 2010/0290768 A1* | 11/2010 | Ke | G03B 17/00 396/55 |

(Continued)

FOREIGN PATENT DOCUMENTS

| | | |
|---|---|---|
| TW | 201037385 A | 10/2010 |
| TW | 201209509 A | 3/2012 |

(Continued)

OTHER PUBLICATIONS

Office Action and search report, dated Oct. 25, 2017, in the corresponding Taiwanese application, No. 105143818.

*Primary Examiner* — Abdelaaziz Tissire
(74) *Attorney, Agent, or Firm* — Muncy, Geissler, Olds & Lowe, P.C.

(57) ABSTRACT

A camera device is provided, which includes an image sensor and an optical lens arranged corresponding to the image sensor. An axis is defined on the light incident surface of the image sensor. The edge of the optical lens includes a straight segment that is parallel to the axis. Since the non-effective area of the optical lens is decreased, the camera module has a smaller size.

18 Claims, 11 Drawing Sheets

(56) References Cited

U.S. PATENT DOCUMENTS

| | | | | |
|---|---|---|---|---|
| 2011/0169920 A1* | 7/2011 | Ryu | ............... | H04N 13/0239 |
| | | | | 348/46 |
| 2012/0050562 A1* | 3/2012 | Perwass | ............ | H04N 5/2254 |
| | | | | 348/222.1 |
| 2013/0222685 A1* | 8/2013 | Topliss | ............ | G02B 27/646 |
| | | | | 348/373 |
| 2014/0063302 A1* | 3/2014 | Shukla | ............ | H04N 5/2254 |
| | | | | 348/294 |
| 2015/0201128 A1* | 7/2015 | Dong | ............ | H04N 5/23287 |
| | | | | 348/208.11 |
| 2015/0316745 A1* | 11/2015 | Chen | ............ | H02K 41/035 |
| | | | | 359/824 |
| 2016/0134813 A1* | 5/2016 | Hu | ............ | H04N 5/2254 |
| | | | | 348/208.11 |
| 2016/0154198 A1* | 6/2016 | Alasimio | ............ | G03B 17/02 |
| | | | | 348/335 |

FOREIGN PATENT DOCUMENTS

| | | |
|---|---|---|
| TW | I456990 B | 10/2014 |
| TW | I515502 B | 1/2016 |
| TW | I551937 B | 10/2016 |

\* cited by examiner

CAMERA DEVICE

CROSS REFERENCE TO RELATED APPLICATIONS

This application claims the benefit of U.S. Provisional Application No. 62/290,869 filed Feb. 3, 2016, and Taiwan Patent Application No. 105143818, filed Dec. 29, 2016, the entirety of which are incorporated by reference herein.

BACKGROUND OF THE DISCLOSURE

Field of the Disclosure

The present disclosure relates to an electronic device and assemblies therewith, and more particularly to a camera device capable of photographing.

Description of the Related Art

With the progress currently being made in several fields of technology, the size of camera devices has become very small. Many kinds of portable electronic devices, such as a mobile phone, have the functionality of digital photography due to the miniaturization of lens modules.

For now, image quality has increased up to 10 million pixels. Generally speaking, it is unavoidable that, in order to capture a high-quality image, components such as image sensors and optical lenses that are used in a camera device must be large in size. However, the inner mechanical space of a portable electronic device is limited. Therefore, how to design a camera device with a small size and yet capable of generating a high-quality image is a problem that needs to be solved.

In another aspect, in order to achieve a specific photographic purpose such as stereoscopic photography, at least two camera devices must be arranged side by side in the electronic device. However, the more modules used in the electronic device, the bigger the size of the electronic device, which goes against the development trend of miniaturization of electronic products. Therefore, how to minimize several functional mechanisms in the cameral module is a subject of research and development by companies in the industry.

BRIEF SUMMARY OF THE DISCLOSURE

Accordingly, one objective of the present disclosure is to provide a camera device that has a small size and provides good image quality. Another objective of the present disclosure is to provide a camera device that includes one or more optical lenses to achieve specific photographic purposes, and the inner space of the camera device is utilized optimally.

For achieving the objectives listed above, according to some embodiments of the disclosure, the camera device includes an image sensor and an optical lens disposed corresponding to the image sensor. An edge of each of the optical lenses includes at least one straight segment, and the two straight segments on the edges of two optical lenses face each other.

In some embodiments, the straight segments of the optical lenses facing each other are disposed between two optical axes of the two optical lenses.

In some embodiments, the two straight segments facing each other are parallel.

In some embodiments, each of the image sensors has a rectangular structure, a transverse axis passes through two long sides of each of the image sensors, and the edge of each of the optical lenses further has two straight segments arranged on the transverse axis and vertical to the transverse axis when the camera device is observed from a top view. In addition, a plurality of longitudinal axes respectively pass through two short sides of the image sensors, and the edge of each of the optical lenses further has two curved segments arranged on the longitudinal axes corresponding thereto when the camera device is observed from a top view.

In some embodiments, the camera device further includes a plurality of driving assemblies respectively driving the optical lenses to move relative to the image sensors. The driving assemblies are respectively disposed on the longitudinal axes, and two driving assemblies corresponding to two of the optical lenses adjacent to each other are disposed on opposite sides of the transverse axis.

In some embodiments, the camera device further includes a substrate disposed between the image sensors and the optical lenses.

In some embodiments, the camera device further includes a housing, and the optical lenses are disposed in a space defined by the housing and the substrate.

In some embodiments, the camera device further includes a plurality of flexible circuit boards, wherein each of the image sensors has a rectangular structure, and the flexible circuit boards are respectively disposed adjacent to a short side of each of the image sensors.

DETAILED DESCRIPTION OF THE ILLUSTRATIVE EMBODIMENTS

Figure 1:
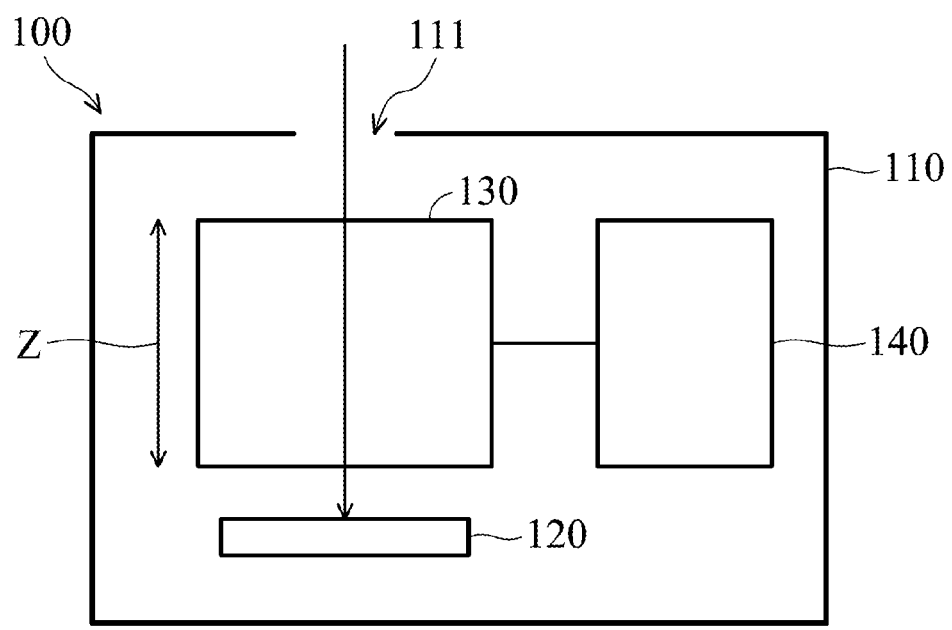
FIG. 1 shows a perspective diagram of a camera device, in accordance with some embodiments.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

It should be understood that component for specific description or specific figures can be present in any forms with which the skilled person is familiar. In addition, when a layer is "above" other layers or a substrate, it might be "directly" on the layers or the substrate, or some other layers are between the layer and other layers.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

FIG. 1 shows a block diagram of a camera device 100 according to some embodiments of the present invention. In some embodiments, the camera device 100 includes a housing 110, an image sensor 120, an optical lens 130, and a driving assembly 140. The housing 110 defines a space for accommodating the image sensor 120, the optical lens 130, and the driving assembly 140.

A light incident hole 111 is formed corresponding to the object side of the optical lens 130, and the image side of the optical lens 130 is disposed corresponding to the image sensor 120. The image sensor 120 can consist of photosensitive elements such as charge couple devices (CCD) or Complementary Metal-Oxide-Semiconductor (CMOS). When the camera device 100 captures images, the light from the light incident hole 111 is received by the optical lens 130 first, and moves along the optical lens 130. Then the light is emitted to the image sensor 120. After the image sensor 120 receives the light, the image sensor 120 sends an electronic signal, so as to generate an image. In some embodiments, the shape of the image sensor 120 is a rectangle, and the ratio of length to width can be 4:3 or 16:9, or can be another arbitrary ratio.

The driving assembly 140 is configured to drive the optical lens 130 to move, so that the optical lens 130 can move relative to the image sensor 120 in the Z direction, so as to achieve the purpose of zooming or focusing. The driving assembly 140 can be a voice coil motor (VCM), a stepper motor, a piezoelectric motor, or any other type of motor. An exemplary embodiment of the driving assembly 140 is disclosed in the camera driving module of U.S. Pat. No. 1,515,502 of R.O.C. issued on Jan. 1, 2016, or the electromagnetic driving module of U.S. Pat. No. 1,551,937 of R.O.C. issued on Oct. 1, 2016. In some embodiments, the driving assembly 140 is omitted, so that the optical lens 130 is disposed on a fixed position relative to the image sensor 120.

In some embodiments, the shape of the optical lens 130 is made according to the shape of the image sensor 120. The area of the conventional circular optical lens which cannot effectively refract light to the image sensor 120 is cut from the optical lens 130, so that most of the light passing through the optical lens 130 can be projected onto the image sensor 120, so as to achieve the purpose of reducing the size of the camera device 100.

Figure 2:
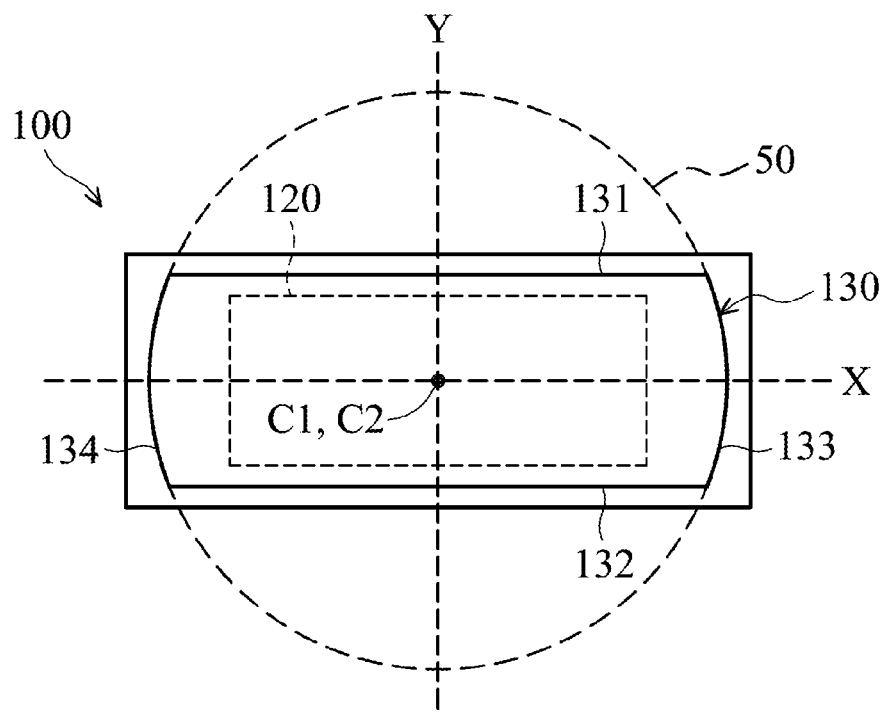
FIG. 2 shows a top view of an optical lens and an image sensor, in accordance with some embodiments.

For example, in the embodiment shown in FIG. 2, an optical axis C2 of the optical lens 130 is disposed corresponding to a center C1 of the image sensor 120. The edge of the optical lens 130 includes a plurality of straight segments, such as a first straight segment 131, a second straight segment 132, and a plurality of curved segments, such as a first curved segment 133 and a second curved segment 134.

The first straight segment 131 and the second straight segment 132 are disposed on opposite sides of a longitudinal axis X and parallel to the longitudinal axis X. The longitudinal axis X passes through the center C1 of the image sensor 120 and parallel to the long side of the image sensor 120. The distance between the first straight segment 131 and the second straight segment 132 is slightly greater than the distance between the two long sides of the image sensor 120 which are parallel to the longitudinal axis X. The first curved segment 133 and the second curved segment 134 are arcs on a circle 50 and are disposed on opposite sides of a transverse axis Y. The transverse axis Y passes through the center C1 of the image sensor 120 and parallel to the short side of the image sensor 120. The first curved segment 133 and the second curved segment 134 connect to and between the first straight segment 131 and the second straight segment 132. A cross-section of the optical lens 130 which is parallel to the image sensor 120 is not entirely symmetrical with respect to the optical axis C2.

In this embodiment, because the outside areas of the first straight segment 131 and the second straight segment 132 of the optical lens 130 which cannot effectively refract light to the image sensor 120 are decreased, the width of the optical lens 130 in the transverse axis Y is less than the width of an optical lens whose area is equal to the area of the circle 50.

Figure 3:
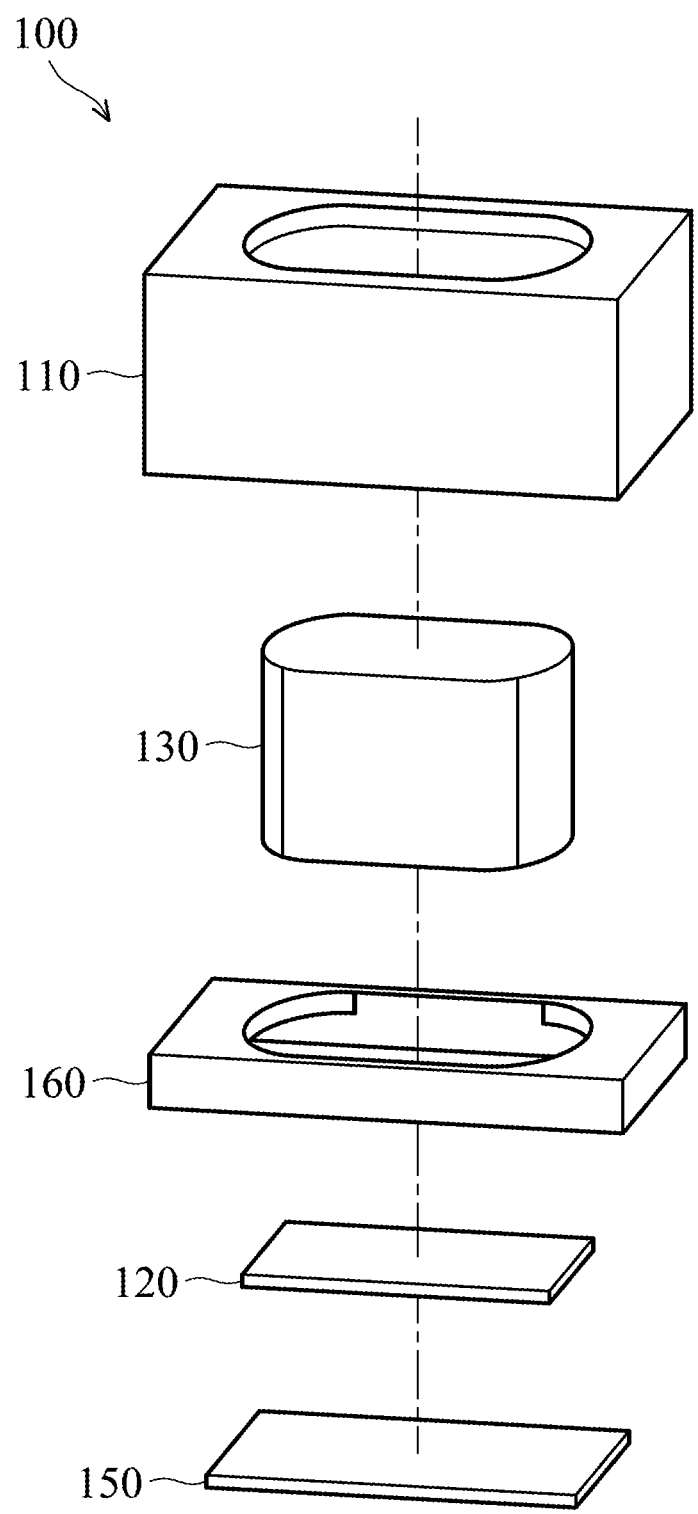
FIG. 3 shows an exploded diagram of the camera device, in accordance with some embodiments.

FIG. 3 shows an exploded diagram of the camera device 100 according to some embodiments of the present invention. In some embodiments, the camera device 100 further includes a circuit board 150 and a lens holder 160. The circuit board 150 is electrically connected to the image sensor 120 and external circuit, so as to transmit the image signal from the image sensor 120 to the external circuit. The lens holder 160 is configured to hold the optical lens 130. In some embodiments, the camera device 100 is equipped with a driving assembly 140, and the optical lens 130 and the lens holder 160 are driven simultaneously to move relative to the image sensor 120.

In some embodiments, the shapes of the housing 110, the circuit board 150 and the lens holder 106 are made to correspond to the optical lens. The straight segment of the edge of the optical lens 130 is parallel to the adjacent sides of the housing 110, the circuit board 150 and the lens holder 160. In addition, the sides of the housing 110, the circuit board 150 and the lens holder 160 near the straight segment are closer to the center of the optical lens 130 than the sides of the housing 110, the circuit board 150 and the lens holder 160 near the curved segment.

Figure 4:
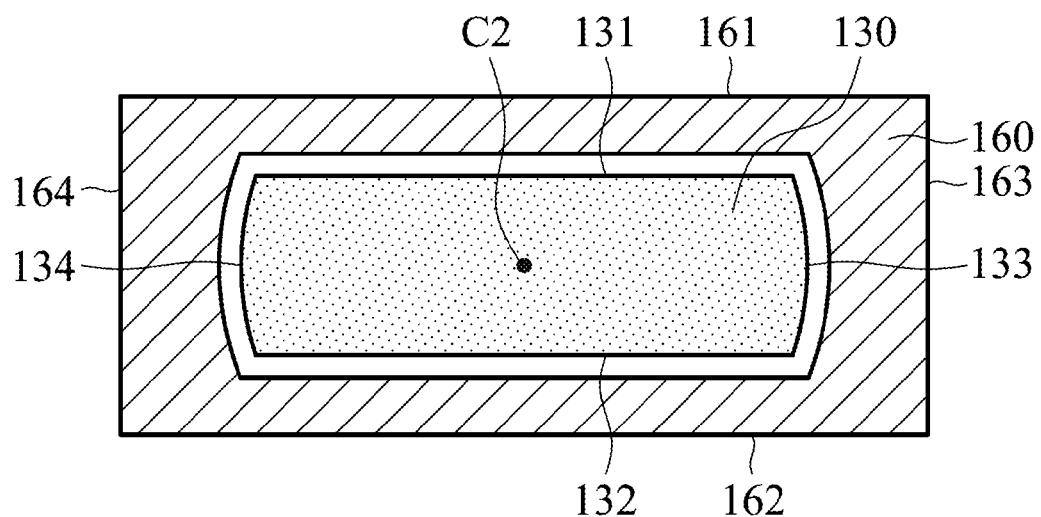
FIG. 4 shows a top view of an optical lens and a lens holder, in accordance with some embodiments.

For example, as shown in FIG. 4, the first straight segment 131 and the second straight segment 132 of the edge of the optical lens 130 are parallel to sides 161 and 162 adjacent to the first straight segment 131 and the second straight segment 132 respectively. Furthermore, the sides 161 and 162 of the lens holder 160 which are adjacent to the first straight segment 131 and the second straight segment 132 are closer to the optical axis C2 than sides 163 and 164, which are adjacent to the first curved segment 133 and the second curved segment 134. The shapes of the housing 110, the circuit board 150 and the lens holder 160 are made corresponding to the optical lens 130, so that when the width of the optical lens 130 decreases, the widths of the housing 110, the circuit board 150 and the lens holder 106 also decrease.

The shape of the optical lens disclosed herein is not limited to the above embodiments. Other aspects of the optical lens are exemplarily described as follows.

Figure 5:
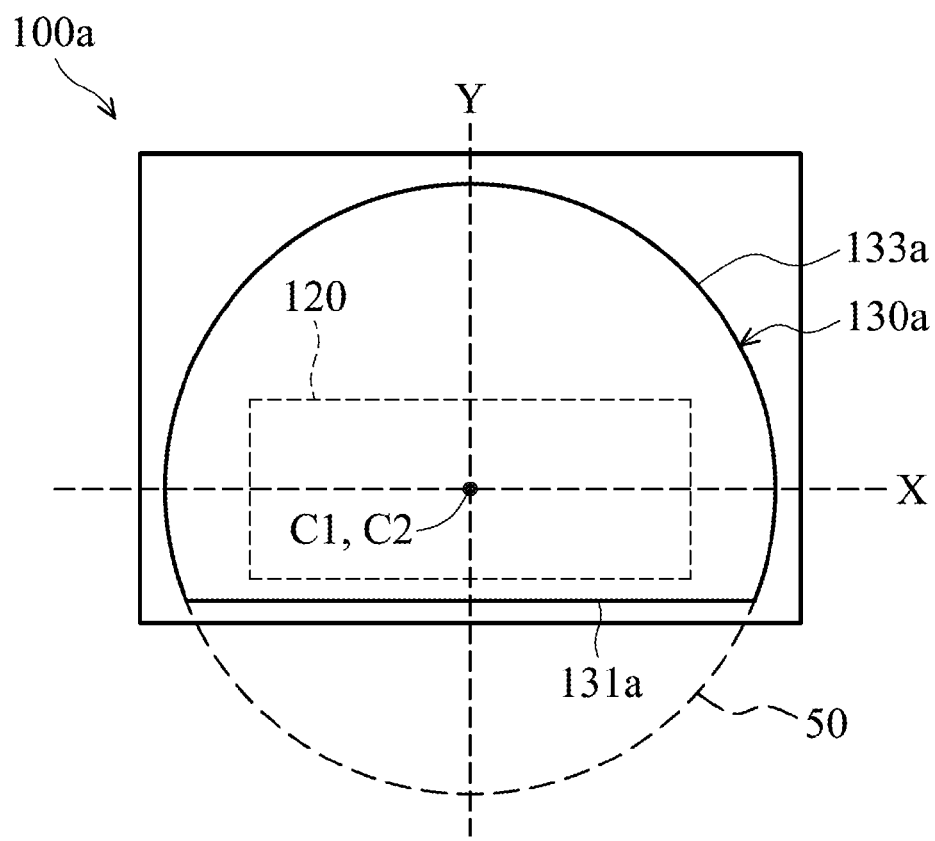
FIG. 5 shows a top view of an optical lens and an image sensor, in accordance with some embodiments.

Please refer to FIG. 5. In this embodiment, an optical lens 130a includes a straight segment, such as a first straight segment 131a, and a curved segment, such as a first curved segment 133a.

The first straight segment 131a is parallel to the longitudinal axis X. The distance between the first straight segment 131a and the longitudinal axis X is slightly greater than the distance between the longitudinal axis X and the one side of the image sensor 120 which is parallel to the longitudinal axis X. The first curved segment 133a is an arc on the circle 50. In addition, the first curved segment 133a is connected to two ends of the first straight segment 131a. A cross-section of the optical lens 130a which is parallel to the image sensor 120 is not entirely symmetrical with respect to the optical axis C2.

In this embodiment, because the outside area of the first straight segment 131a of the optical lens 130a which cannot effectively refract light to the image sensor 120 is decreased, the width of the optical lens 130a in the transverse axis Y is less than the width of an optical lens whose area is equal to the area of the circle 50. As a result, when the optical lens 130a is utilized in a camera device 100a, the width of the camera device 100 in the transverse axis Y is less than the width a camera device utilizing a circular optical lens.

Figure 6:
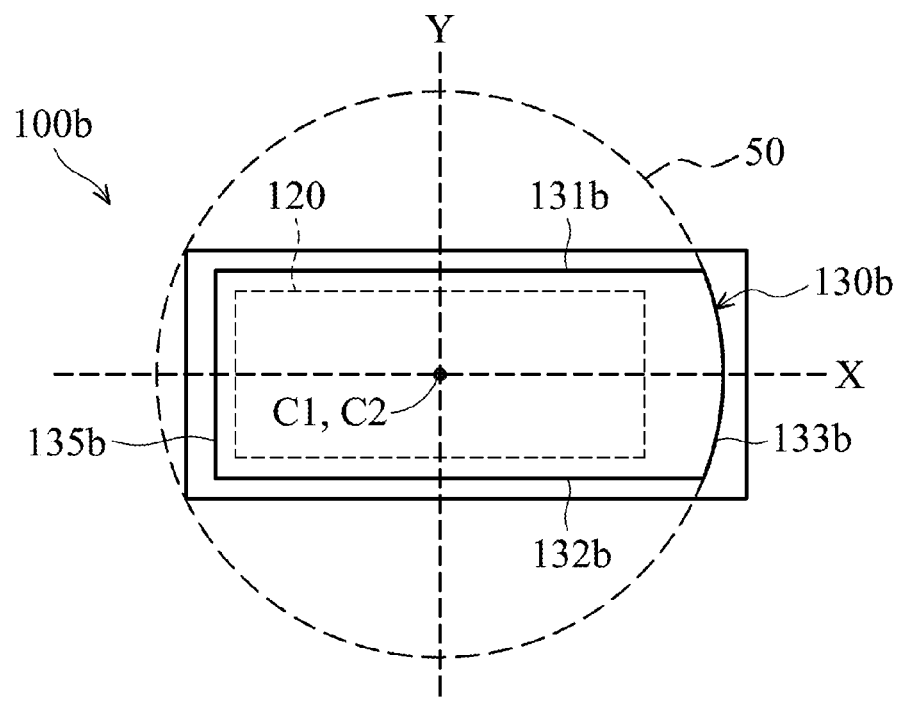
FIG. 6 shows a top view of an optical lens and an image sensor, in accordance with some embodiments.

Please refer to FIG. 6. In this embodiment, the optical lens 130b includes a plurality of straight segments, such as a first straight segment 131b, a second straight segment 132b, a third straight segment 135b, and a curved segment, such as a first curved segment 133b.

The first straight segment 131b and the second straight segment 132b are disposed face to face and are parallel to the longitudinal axis X. The distance between the first straight segment 131b and the second straight segment 132b is slightly greater than the distance between the two long sides of the image sensor 120 parallel to the longitudinal axis X. The third straight segment 135b is parallel to the transverse axis Y and is connected to one end of the first straight segment 131b and one end of the second straight segment 132b. The distance between the third straight segment 135b and the transverse axis Y is slightly greater than the distance between the transverse axis Y and any one of the two short sides of the image sensor 120 parallel to the transverse axis Y.

The first curved segment 133b is an arc on the circle 50. Furthermore, the first curved segment 133b is connected to the other end of the first straight segment 131b and the other end of the second straight segment 132b. A cross-section of the optical lens 130b which is parallel to the image sensor 120 is not entirely symmetrical with respect to the optical axis C2.

In this embodiment, because the outside areas of the first straight segment 131b, the second straight segment 132b and third straight segment 135b of the optical lens 130b which cannot effectively refract light to the image sensor 120 are decreased, the width in the transverse axis Y and the length in the longitudinal axis X of the optical lens 130b are respectively less than the width and length of an optical lens whose area is equal to the area of the circle 50. As a result, when the optical lens 130b is utilized in a camera device 100b, the width in the transverse axis Y and the length in the longitudinal axis X of the camera device 100b are respectively less than the width and length of a camera device utilizing a circular optical lens.

Figure 7:
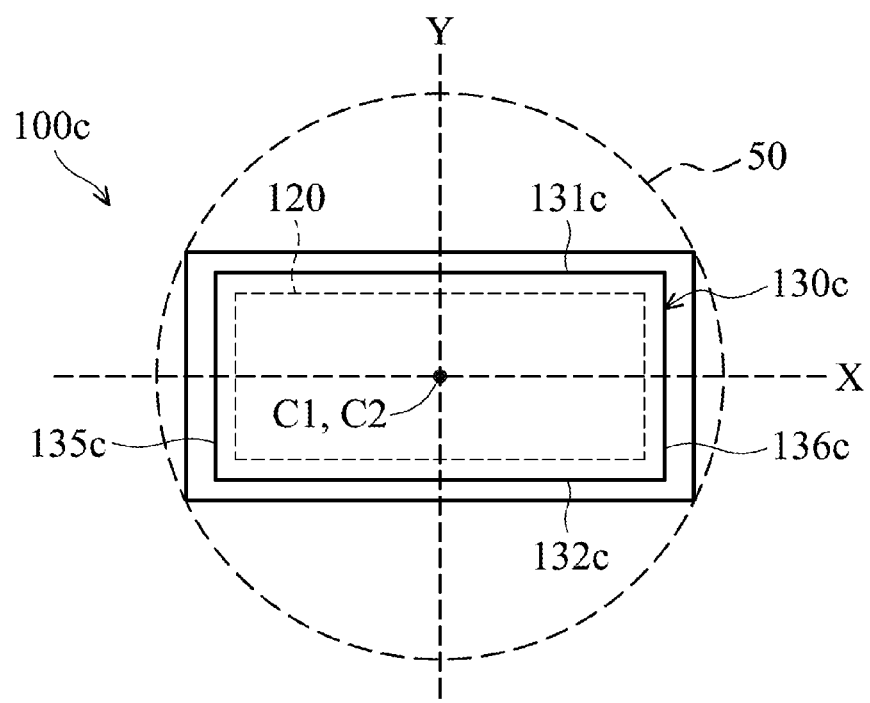
FIG. 7 shows a top view of an optical lens and an image sensor, in accordance with some embodiments.

Please refer to FIG. 7, in some embodiments, an optical lens 130c includes a straight segment, such as a first straight segment 131c, a second straight segment 132c, a third straight segment 135c, and a fourth straight segment 136c.

The first straight segment 131c and the second straight segment 132c are disposed face to face and are parallel to the longitudinal axis X. The distance between the first straight segment 131c and the second straight segment 132c is slightly greater than the distance between the two long sides of the image sensor 120 parallel to the longitudinal axis X. The third straight segment 135c and the fourth straight segment 136c are disposed face to face and are parallel to the transverse axis Y. The distance between the third straight segment 135c and the fourth straight segment 136c is slightly greater than the distance between two short sides of the image sensor 120 parallel to the transverse axis Y. A cross-section of the optical lens 130c which is parallel to the image sensor 120 is not entirely symmetrical with respect to the optical axis C2.

In this embodiment, because the outside areas of the first straight segment 131c, the second straight segment 132c, the third straight segment 135c and the fourth straight segment 136c of the optical lens 130c which cannot effectively refract light to the image sensor 120 are decreased, the width in the transverse axis Y and the length in the longitudinal axis X of the optical lens 130c are respectively less than the width and length of an optical lens whose area is equal to the area of the circle 50. As a result, when the optical lens 130c is utilized in a camera device 100c, the width in the transverse axis Y and the length in the longitudinal axis X of the camera device 100c are respectively less than the width and length of the camera device utilizing a conventional circular optical lens.

Figure 8:
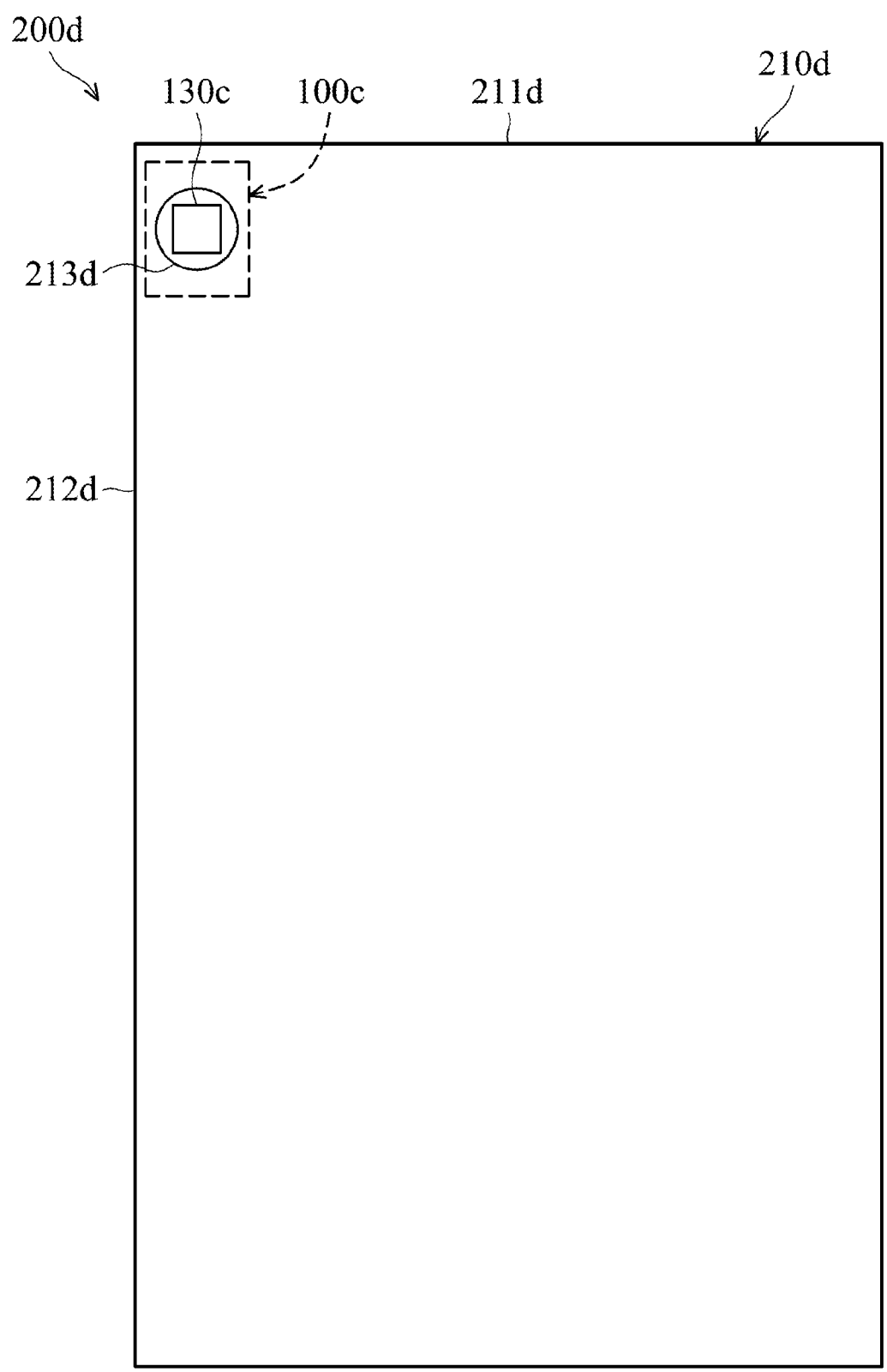
FIG. 8 shows a perspective diagram of an electronic device, in accordance with some embodiments.

FIG. 8 shows a diagram of an electronic device 200d according to some embodiments of the present invention. The electronic device 200d includes the camera device 100c and a housing 210d. The housing 210d includes a side 211d and a side 212d, wherein the side 211d is perpendicular to the side 212d. A light incident hole 213d is disposed near an intersection angle of the side 211d and the side 212d. The camera device 100c includes an optical lens 130c and an image sensor 120 (as shown in FIG. 7). The optical lens 130c is disposed corresponding to the light incident hole 213d.

In this embodiment, because the edge of the optical lens 130c has four straight segments, the width of the camera device 100c is smaller. As a result, the optical axis C2 of the optical lens 130c is closer to the side 211d and the side 212d in the horizontal direction and the vertical direction than the optical axis of the conventional circular optical lens.

Figure 9:
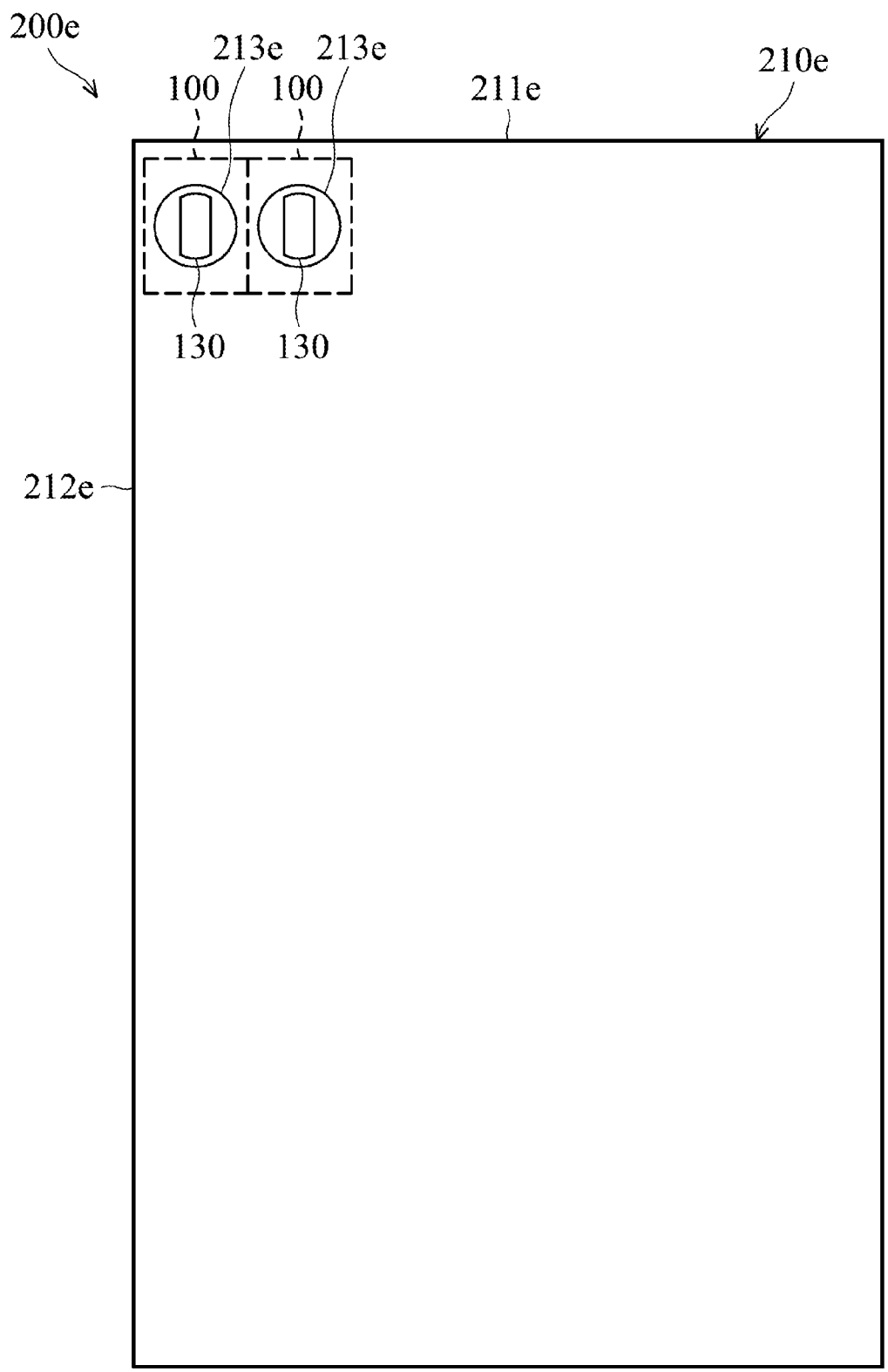
FIG. 9 shows a perspective diagram of an electronic device, in accordance with some embodiments.
Figure 10:
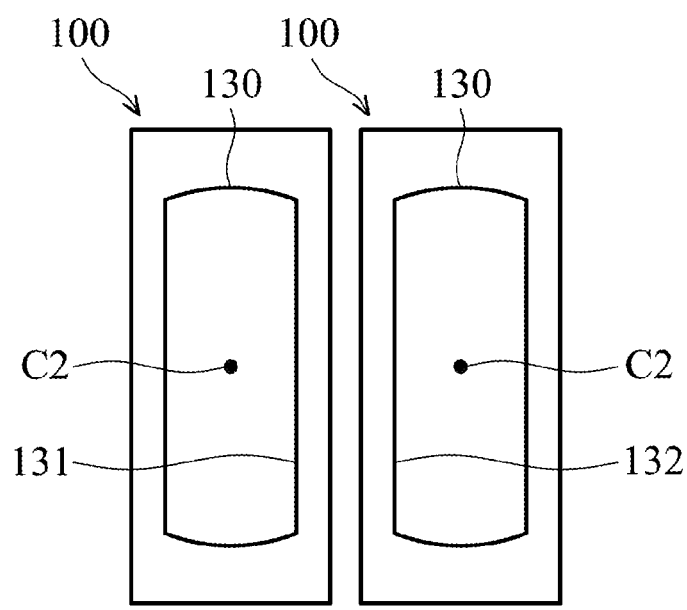
FIG. 10 shows two adjacent camera devices, in accordance with some embodiments.

FIG. 9 shows a diagram of an electronic device 200e according to some embodiments of the present invention. The electronic device 200e includes two camera devices 100 shown in FIG. 3 and housing 210e. The housing 210e includes a side 211*e* and a side 212*e*, wherein the side 211*e* is perpendicular to the side 212*e*. Two light incident holes 213*e* are disposed near an intersection angle of the side 211*e*, and the side 212*e*, and the two incident holes 213*e* are arranged in a direction parallel to the side 211*e*. The optical lenses of the two camera devices 100 are disposed corresponding to the two respective incident holes 213*e*. As shown in FIG. 10, the first straight segment 131 and the second straight segment 132 of the two optical lenses 130 disposed between the two optical axes C2 face each other. Because the optical axes C2 of the two optical lenses 130 are closer to each other than the center of the two optical lenses, there can be more electronic components accommodated in the housing 210*e*.

It should be noted that when the distance between two lenses increases, the system of the rear terminal generally needs more time to perform image processing due to the large difference between the two images captured by two respective lenses, and ideal image quality cannot be obtained. Conversely, when the distance between the two lenses decreases, a clear image can be obtained because the two images captured by the two lenses are more similar, and the focus time for different images decreases as well. In this embodiment, the light for generating the image passes through the two optical lenses 130 and the distance between the optical lenses 130 is relatively short, so that the image quality and time required for image processing of the electronic device 200*e* can be improved.

Figure 11:
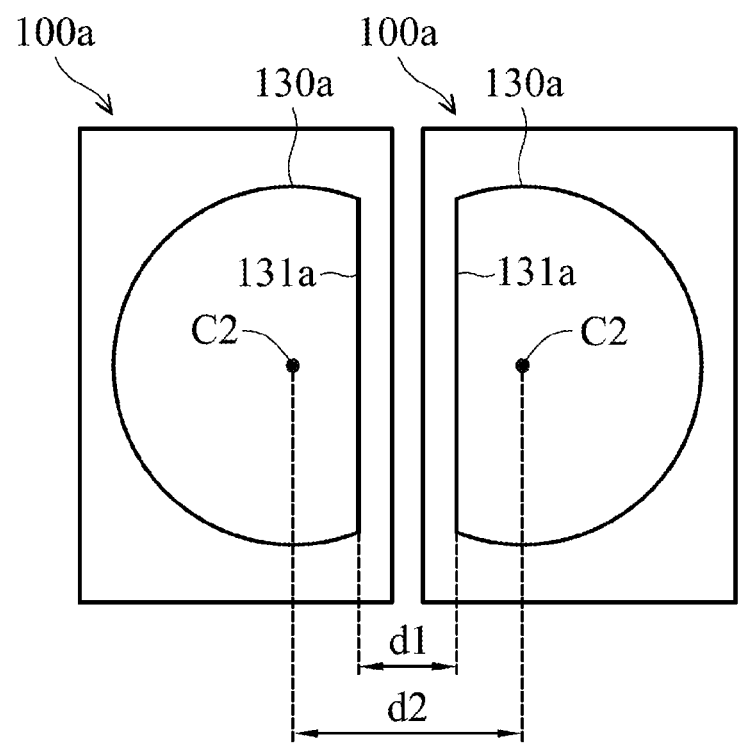
FIG. 11 shows two adjacent camera devices, in accordance with some embodiments.

In other embodiments, the two camera devices 100 in FIG. 9 can be replaced by two camera devices 100*a*. Each of the two camera devices 100*a* includes an optical lens 130*a*. As shown in FIG. 11, the first straight segment 131*a* of the optical lens 130*a* on the left side corresponds to the first straight segment 131*a* of the optical lens 130*a* on the right side. The two first straight segments 131*a* are disposed between two optical axes C2 of the two optical lenses 130*a*, and the distance d1 between the two first straight segments 131 is less than the distance d2 between the two optical axes C2 of the two optical lenses 130*a*.

Figure 12:
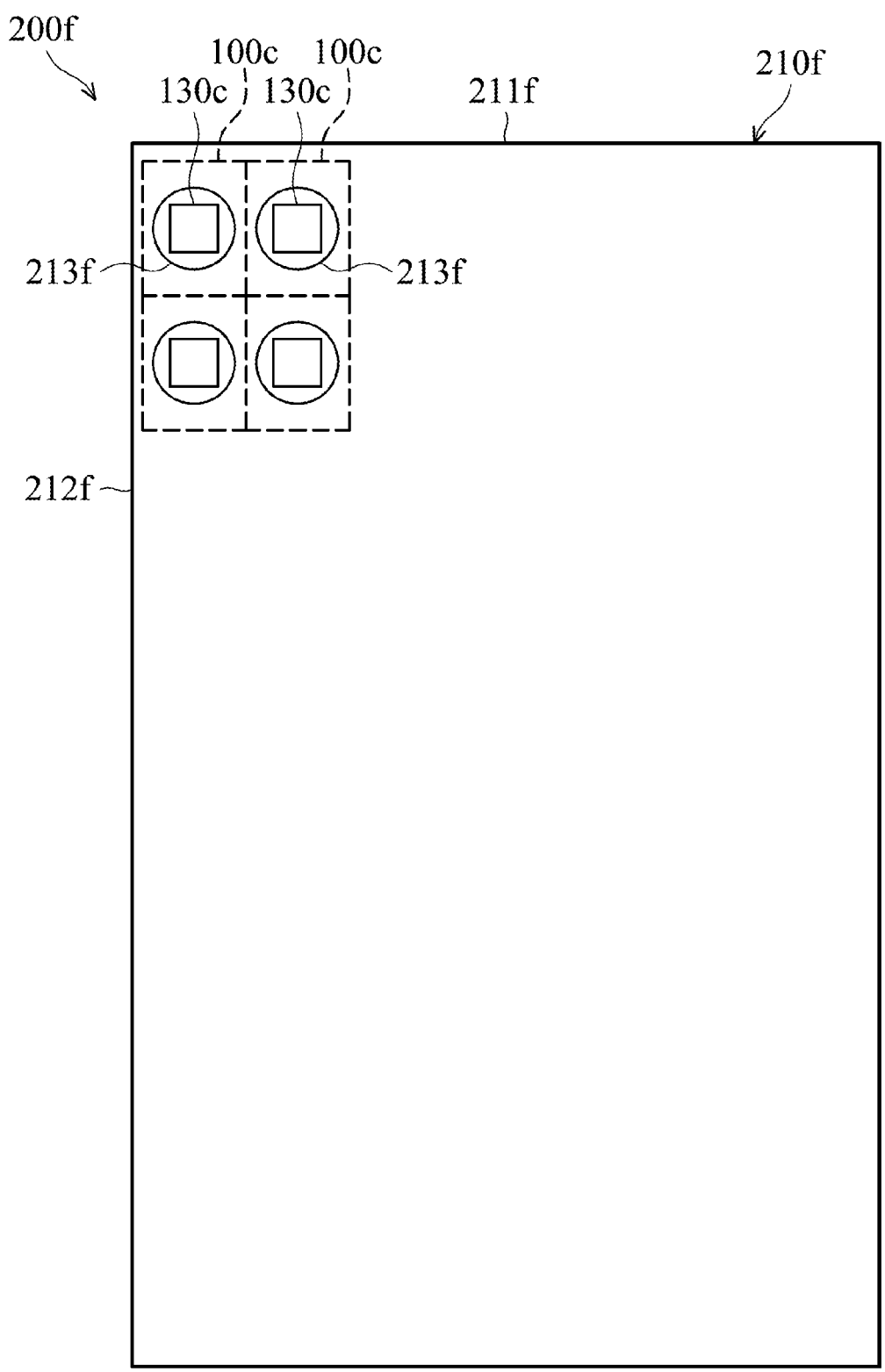
FIG. 12 shows a perspective diagram of an electronic device, in accordance with some embodiments.
Figure 13:
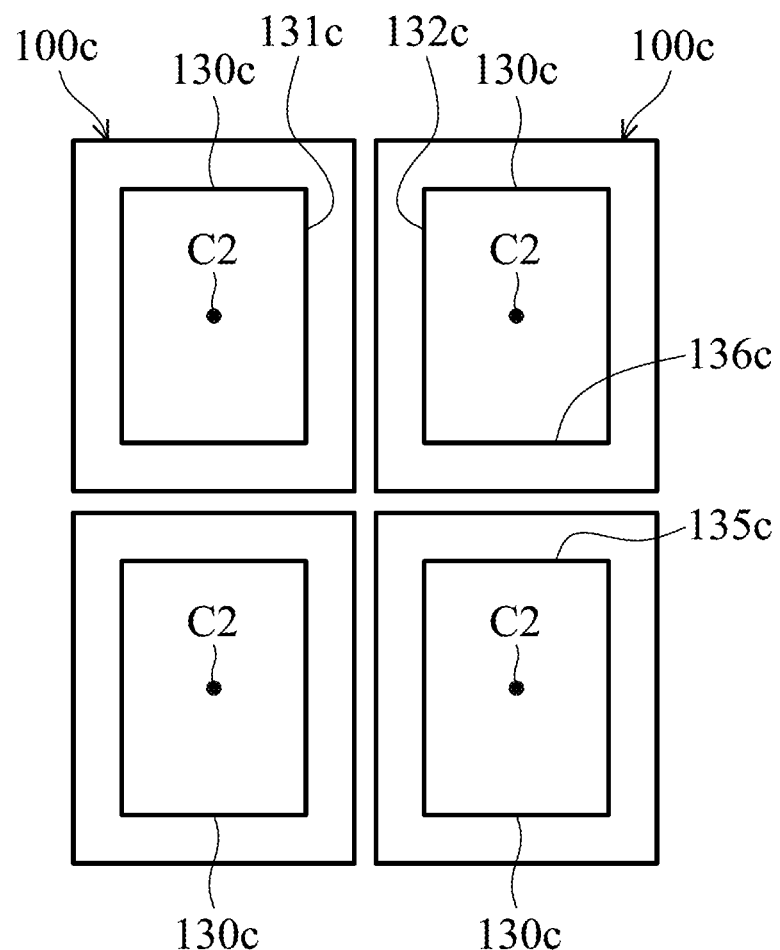
FIG. 13 shows a perspective diagram of four adjacent camera devices, in accordance with some embodiments.

FIG. 12 shows a diagram of an electronic device 200*f* according to some embodiments of the present invention. The electronic device 200*f* includes four camera devices 100*c* and housing 210*f*. The housing 210*f* includes a side 211*f* and a side 212*f*, wherein the side 211*f* is perpendicular to the side 212*f*. Four light incident holes 213*f* are disposed near an intersection angle of the side 211*f* and the side 212*f*, and the four incident holes 213*f* are arranged in a matrix (2*2). Each of the four camera devices 100*c* includes an optical lens 130*c* and an image sensor 120 (as shown in FIG. 7). The optical lens 130*c* is disposed corresponding to the incident hole 213*f*. As shown in FIG. 13, the first straight segment 131*c* and the second straight segment 132*c* of two adjacent optical lenses 130*c* in the horizontal direction face each other. In addition, the third straight segment 135*c* and the fourth straight segment 136*c* of two adjacent optical lenses 130*c* in the vertical direction face each other.

In this embodiment, because the optical axes C2 of the four optical lenses 130 are closer to each other than the center of four conventional circular optical lenses, there can be other electronic components accommodated in the housing 210*f*. Conversely, the light for generating the image passes through the four optical lenses 130 and the distance between each two adjacent lenses among the four optical lenses 130 is relatively short, so that the image quality and time required for image processing of the electronic device 200*f* can be improved.

Figure 14:
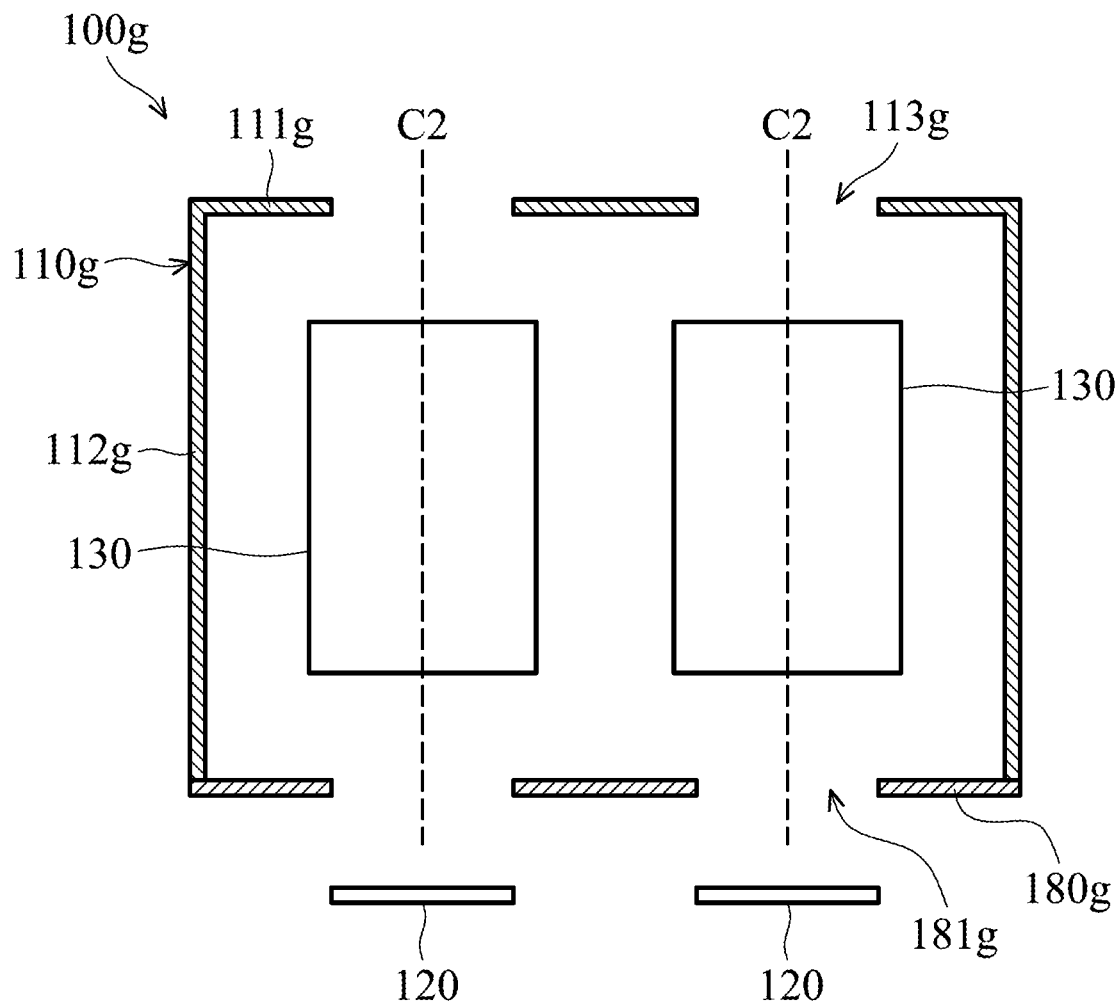
FIG. 14 shows a cross-sectional view of a camera device, in accordance with some embodiments.
Figure 15:
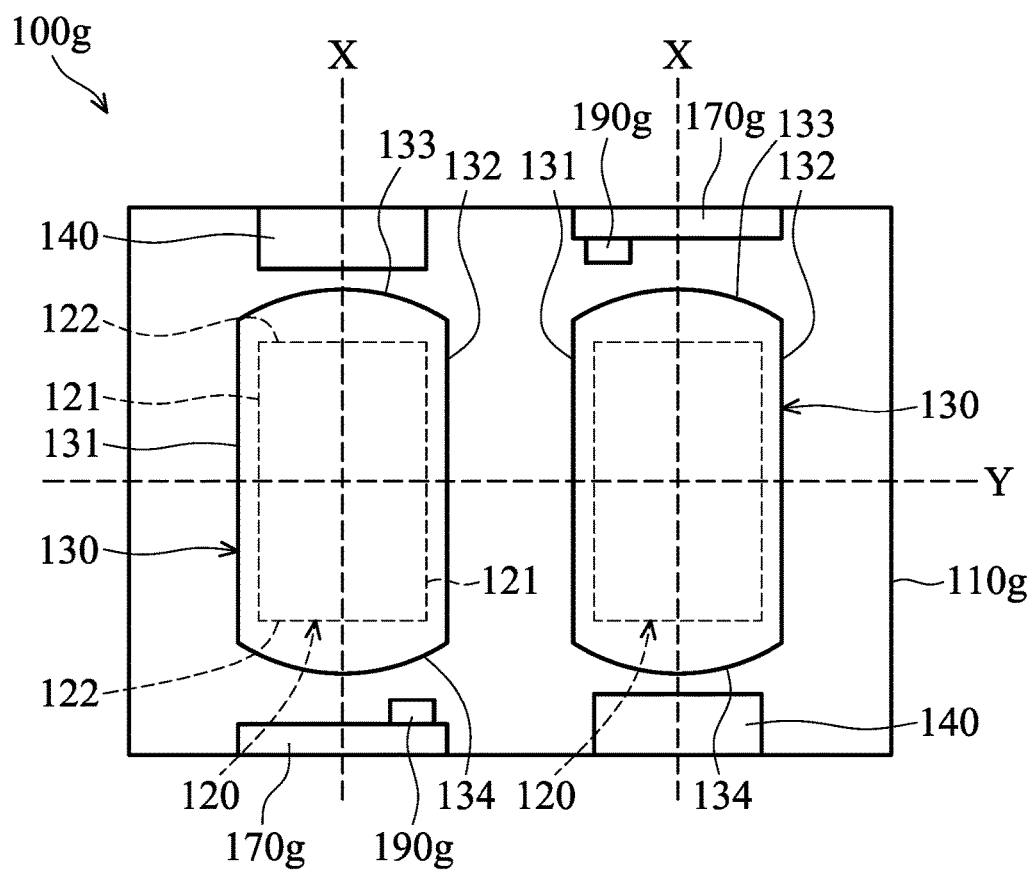
FIG. 15 shows a top view of a camera device, in accordance with some embodiments.

FIG. 14 shows a sectional diagram of a camera device 100*g* according to some embodiments of the present invention. FIG. 15 shows a top view of the camera device 100*g* according to some embodiments of the disclosure. In the embodiments of FIG. 14 and FIG. 15, features which are the same as or similar to features shown in FIGS. 1-4 are denoted by the same reference numbers, and these feature are not described again.

According to some embodiments of the disclosure, the camera device 100*g* includes a housing 110*g*, two image sensors 120, two optical lenses 130, two driving assemblies 140, two flexible circuit boards 170*g*, a substrate 180*g*, and two position sensing components 190*g*.

In some embodiments, the housing 110*g* includes a rectangular upper housing 111*g* and a side housing 112*g*. Two light incident holes 113*g* are aligned with the optical axes C2 of the two optical lenses 130 and formed on the front housing 111*g*. The side housing 112*g* extends from the edge of the upper housing 111*g* toward the substrate 180*g* and connects to the substrate 180*g*. The substrate 180*g* faces the upper housing 111*g*. Two openings 181*g* are aligned with the optical axes C2 of the two optical lenses 130 and are formed on the substrate 180*g*.

The two optical lenses 130 are disposed inside a space defined by the housing 110*g* and the substrate 180*g*. The two image sensors 120 respectively face the two optical lenses 130, and the substrate 180*g* is disposed between the image sensor 120 and the optical lens 130. In some embodiments, as shown in FIG. 15, the transverse axis Y passes through two long sides 121 of each image sensor 120, and the transverse axis Y passes through the first straight segment 131 and the second straight segment 132. The straight segments of two adjacent optical lenses 130 face each other and are parallel to each other. The transverse axis Y is perpendicular to the first straight segment 131 and the second straight segment 132 of each optical lens 130. Furthermore, the two longitudinal axes X respectively pass through two short sides 122 of the image sensor 120 and pass through the first curved segment 133 and second curved segment 134 of each optical lens 130.

The driving assembly 140 is disposed on the longitudinal axis X and near the short side 122 of the image sensor 120. The driving assembly 140 is configured to drive a single optical lens 130 relative to the image sensor 120. It should be noted that the two driving assemblies 140 corresponding to the two adjacent optical lenses 130 are disposed at two opposite sides of the transverse axis Y. For example, as shown in FIG. 15, the driving assembly 140 corresponding to the optical lens 130 on the left side is disposed at the upper side of the transverse axis Y, and the driving assembly 140 corresponding to the optical lens 130 on the right side is disposed at the lower side of the transverse axis Y.

The flexible circuit board 170*g* is disposed on the longitudinal axes X and is near the short side 122 of the image sensor 120. It should be noted that the two flexible circuit boards 170*g* corresponding to the two adjacent optical lenses 130 are disposed at two opposite sides of the transverse axis Y. For example, as shown in FIG. 15, the flexible circuit board 170*g* corresponding to the optical lens 130 on the left side is disposed at the lower side of the transverse axis Y, and the flexible circuit board 170*g* corresponding to the optical lens 130 on the right side is disposed at the upper side of the transverse axis Y. The two position sensing components 190*g*, such as a Hall sensor, are respectively disposed on the two flexible circuit boards 170*g* and electrically connect to an external circuit (not shown in the figures) through the flexible circuit boards 170*g*. This configuration can prevent or decrease magnetic interference due to the driving assemblies 140 from interfering with the position sensing components 190g, so that the sensing accuracy of the position sensing component 190g is improved. Moreover, the position of the optical lens 130 can be controlled more precisely due to the improved sensing accuracy.

It should be understood that the driving assembly 140 and the flexible circuit boards 170g are disposed at opposite sides of the corresponding optical lens 130 in the embodiment of FIG. 15, but it is not limited thereto. The driving assembly 140 and the flexible circuit boards 170g can be disposed at the same side of the corresponding optical lens 130.

In the embodiment shown in FIG. 14 and FIG. 15, a plurality of optical lenses 130 share the housing 110 and the substrate 180g, so that the camera device 100g includes less assemblies, and the assembly procedure can be simplified. Furthermore, the driving assembly 140 and the flexible circuit boards 170g are disposed near the short sides 122 of the corresponding image sensor 120, and the straight segment of the optical lens 130 is parallel to the long side 121 of the image sensor 20, so that the camera device 100g has a smaller size than a conventional camera device with dual lenses.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A camera device, comprising:
    a plurality of image sensors, arranged in a matrix;
    at least two optical lenses adjacent to each other, facing the image sensors, wherein an edge of each of the optical lenses has at least one straight segment, and the straight segments on the edges of the two neighboring optical lenses face each other; and
    a plurality of driving assemblies, for driving the optical lenses to move relative to the image sensors;
    wherein each of the image sensors has a rectangular structure, a transverse axis passes through two long sides of each of the image sensors, and a plurality of longitudinal axes pass through two short sides of the image sensors when the camera device is observed from a top view;
    wherein the driving assemblies are respectively disposed on the longitudinal axes, and two driving assemblies corresponding to the two neighboring optical lenses are disposed on opposite sides of the transverse axis.

2. The camera device as claimed in claim 1, wherein the straight segments of the optical lenses facing each other are disposed between two optical axes of the two optical lenses.

3. The camera device as claimed in claim 1, wherein the two straight segments facing each other are parallel to each other.

4. The camera device as claimed in claim 1, wherein each of the image sensors has a rectangular structure, a transverse axis passes through two long sides of each of the image sensors, and the edge of each of the optical lenses further has two straight segments arranged on the transverse axis when the camera device is observed from a top view.

5. The camera device as claimed in claim 4, wherein the two straight segments of the optical lens are perpendicular to the transverse axis.

6. The camera device as claimed in claim 4, wherein a plurality of longitudinal axes pass through two short sides of the image sensors, and the edge of each of the optical lenses further has two curved segments arranged on the longitudinal axes corresponding thereto when the camera device is observed from a top view.

7. The camera device as claimed in claim 4, wherein a plurality of longitudinal axes pass through two short sides of the image sensors, and the edge of each of the optical lenses further has one curved segment and one straight segment arranged on the longitudinal axes corresponding thereto when the camera device is observed from a top view.

8. The camera device as claimed in claim 7, wherein a cross-section of the optical lens which is parallel to the image sensor is not entirely symmetrical with respect to an optical axis of the optical lens.

9. The camera device as claimed in claim 4, wherein a plurality of longitudinal axes pass through two short sides of the image sensors, and the edge of each of the optical lenses further has two straight segments arranged on the longitudinal axes corresponding thereto when the camera device is observed from a top view.

10. The camera device as claimed in claim 1, further comprising a substrate disposed between the image sensors and the optical lenses.

11. The camera device as claimed in claim 10, further comprising a housing, wherein the optical lenses are disposed in a space defined by the housing and the substrate.

12. The camera device as claimed in claim 1, further comprising a plurality of flexible circuit boards, wherein each of the image sensors has a rectangular structure, and the flexible circuit boards are disposed adjacent to a short side of each of the image sensors.

13. The camera device as claimed in claim 1, wherein the edge of each of the optical lenses further has a curved segment connected to two ends of the straight segment.

14. The camera device as claimed in claim 13, wherein a cross-section of the optical lens which is parallel to the image sensor is not entirely symmetrical with respect to an optical axis of the optical lens.

15. The camera device as claimed in claim 1, further comprising a plurality of lens holders, wherein the optical lenses are disposed in the lens holders, and the straight segment of each of the optical lenses is parallel to a neighboring side of a corresponding lens holder.

16. An electronic device, comprising:
    a housing, having a plurality of incident hole arranged in a matrix;
    a plurality of optical lenses, each of the optical lenses facing one of the incident holes, and an edge of each of the optical lenses has at least one straight segment, and the straight segments on the edges of the two neighboring optical lenses face each other;

a plurality of image sensors, each facing one of the optical lenses; and a plurality of driving assemblies, for driving the optical lenses to move relative to the image sensors;

wherein each of the image sensors has a rectangular structure, a transverse axis passes through two long sides of each of the image sensors, and a plurality of longitudinal axes pass through two short sides of the image sensors when the electronic device is observed from a top view;

wherein the driving assemblies are respectively disposed on the longitudinal axes, and two driving assemblies corresponding to the two neighboring optical lenses are disposed on opposite sides of the transverse axis.

17. The electronic device as claimed in claim 16, wherein each of the image sensors has a rectangular structure, a transverse axis passes through two long sides of each of the image sensors, and the edge of each of the optical lenses further has two straight segments arranged on the transverse axis when the electronic device is observed from a top view.

18. The electronic device as claimed in claim 16, further comprising a plurality of lens holders, wherein the optical lenses are disposed in the lens holders, wherein the straight segment of each of the optical lenses is parallel to a neighboring side of a corresponding lens holder.

\* \* \* \* \*